(12) United States Patent
Dutta

(10) Patent No.: US 7,372,144 B2
(45) Date of Patent: May 13, 2008

(54) HIGH SPEED ELECTRONICS INTERCONNECT AND METHOD OF MANUFACTURE

(75) Inventor: Achyut Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 376 days.

(21) Appl. No.: 10/793,576

(22) Filed: Mar. 4, 2004

(65) Prior Publication Data

US 2004/0173822 A1 Sep. 9, 2004

Related U.S. Application Data

(60) Provisional application No. 60/451,950, filed on Mar. 5, 2003.

(51) Int. Cl.
*H01L 21/00* (2006.01)

(52) U.S. Cl. ............... 257/700; 257/664; 257/208

(58) Field of Classification Search ......... 257/700, 257/208, 664
See application file for complete search history.

(56) References Cited

U.S. PATENT DOCUMENTS

| | | | |
|---|---|---|---|
| 5,105,055 A * | 4/1992 | Mooney et al. ............... 174/27 |
| 6,424,092 B1 * | 7/2002 | Odake et al. ............ 315/169.3 |
| 6,819,373 B2 * | 11/2004 | Farquhar et al. ............. 349/86 |
| 6,967,705 B2 * | 11/2005 | Farquhar et al. ............. 349/193 |
| 2004/0066478 A1 * | 4/2004 | Farquhar et al. ............. 349/117 |
| 2004/0173822 A1 * | 9/2004 | Dutta ......................... 257/208 |
| 2004/0173880 A1 * | 9/2004 | Achyut ....................... 257/664 |
| 2004/0174223 A1 * | 9/2004 | Achyut ........................... 333/1 |
| 2005/0019527 A1 * | 1/2005 | Farquhar et al. ............. 428/131 |
| 2005/0110138 A1 * | 5/2005 | Dutta ......................... 257/735 |

(Continued)

Primary Examiner—Laura M. Schillinger

(57) ABSTRACT

Fundamental interconnect systems for connecting high-speed electronics elements are provided. Interconnect system has the means, which could reduce the microwave loss by reducing the effective dielectric loss and dielectric constant of the interconnect system, and increase the bandwidth of the interconnects and also reduce the signal propagation delay, respectively. Ideally, the speed of the electrical signal on the signal line can be reached to speed of the light in the air, and the bandwidth can be reached to closer to the optical fiber. The interconnect systems consists of the signal line, dielectric system with opened trench or slot filled up with the air or lower dielectric loss material, and the ground plan. The signal line proposed in this invention could be made any type of signal line configuration for example, microstripline, strip line or coplanar line. The signal line can also be made as single ended or differential pairs of any configurations. The interconnect system based on the fundamental techniques provided in this invention, can be used for on-chip interconnects where the high speed electronics devices are connected by the signal line laid on the oxide or dielectric material. Again, the interconnect system based on the fundamental techniques provided in this invention, can also be used for off-chip interconnects (chip-to-chip interconnects), where the whole portion or portion of the PCB on which high speed chips are to be connected, are having the dielectric system with opened trench or slot to reduce the microwave loss. High scale chip-to-chip interconnection using of the multilayered PCB is possible. The fundamental techniques provided in this invention can also be used for high-speed connectors and high-speed cables. The main advantages of this invention are to make high speed interconnects systems for on-chip and off-chip interconnects. More over, this fundamental technology is also used for the high sped die package, high speed connector, and high speed cables where conventional manufacturing technology can be used and yet to increase the bandwidth of the interconnects.

17 Claims, 12 Drawing Sheets

U.S. PATENT DOCUMENTS

2005/0168304 A1* 8/2005 Yamaguchi et al. ........ 333/246
2005/0237137 A1* 10/2005 Dutta .......................... 333/246
2006/0028305 A1* 2/2006 Dutta et al. ................. 333/238

* cited by examiner

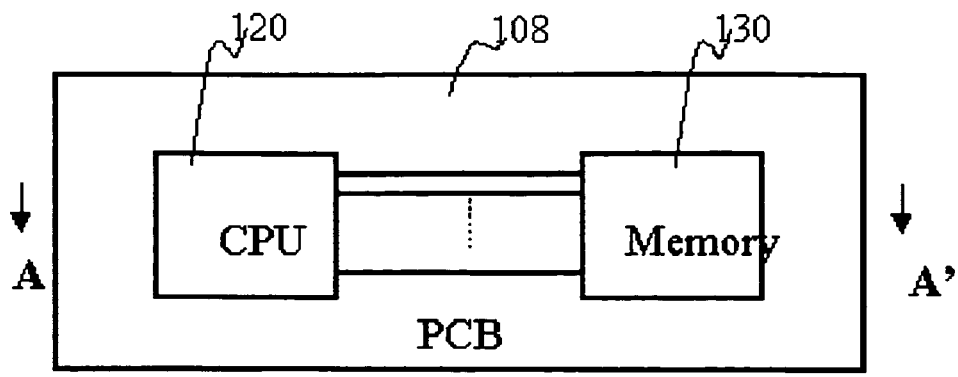
FIG. 2A
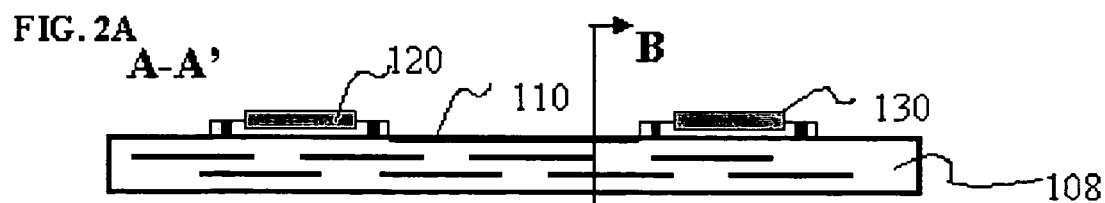
FIG. 2B
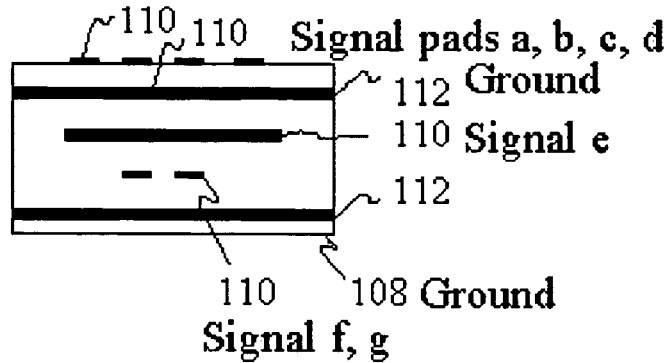
FIG. 2C
FIG. 2

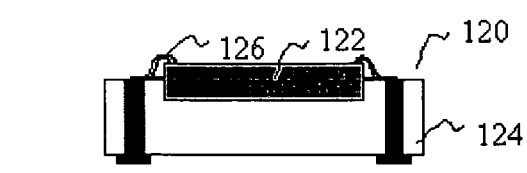
FIG.3A
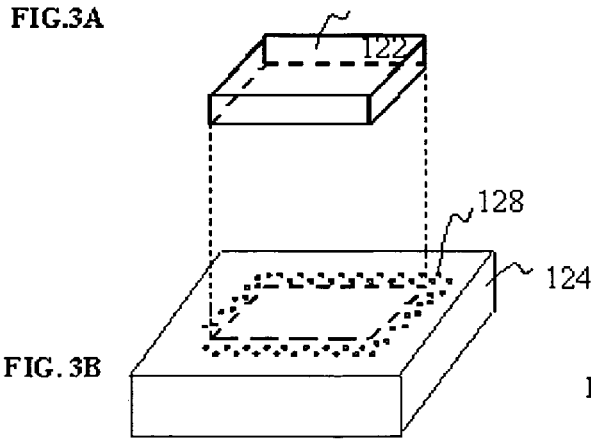
FIG.3B
FIG. 3
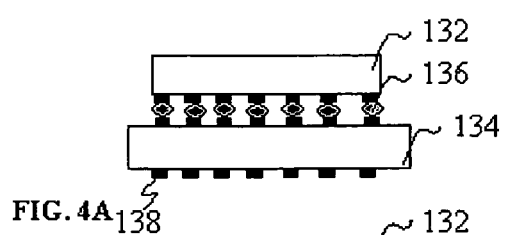
FIG.4A
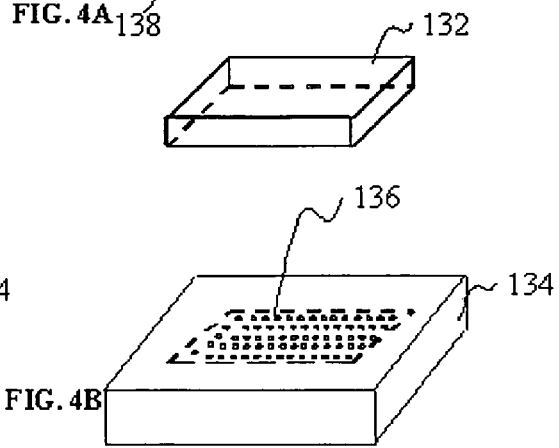
FIG.4B
FIG. 4

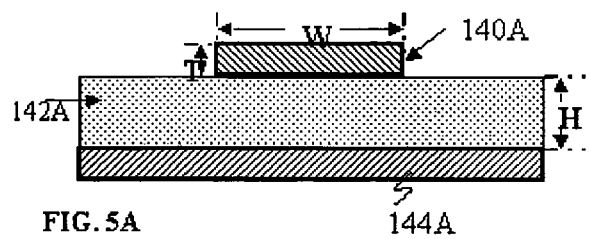
FIG. 5A
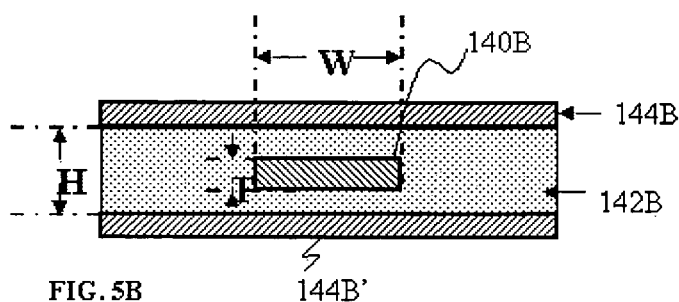
FIG. 5B
FIG. 5
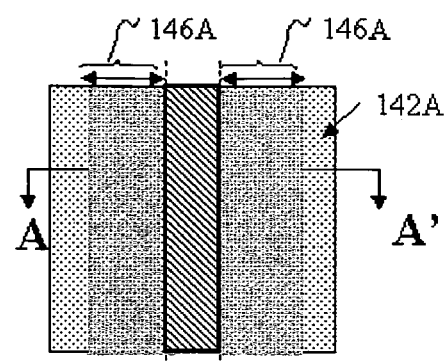
FIG. 6A
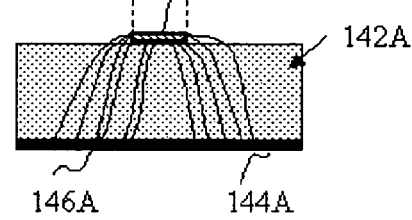
FIG. 6B
FIG. 6

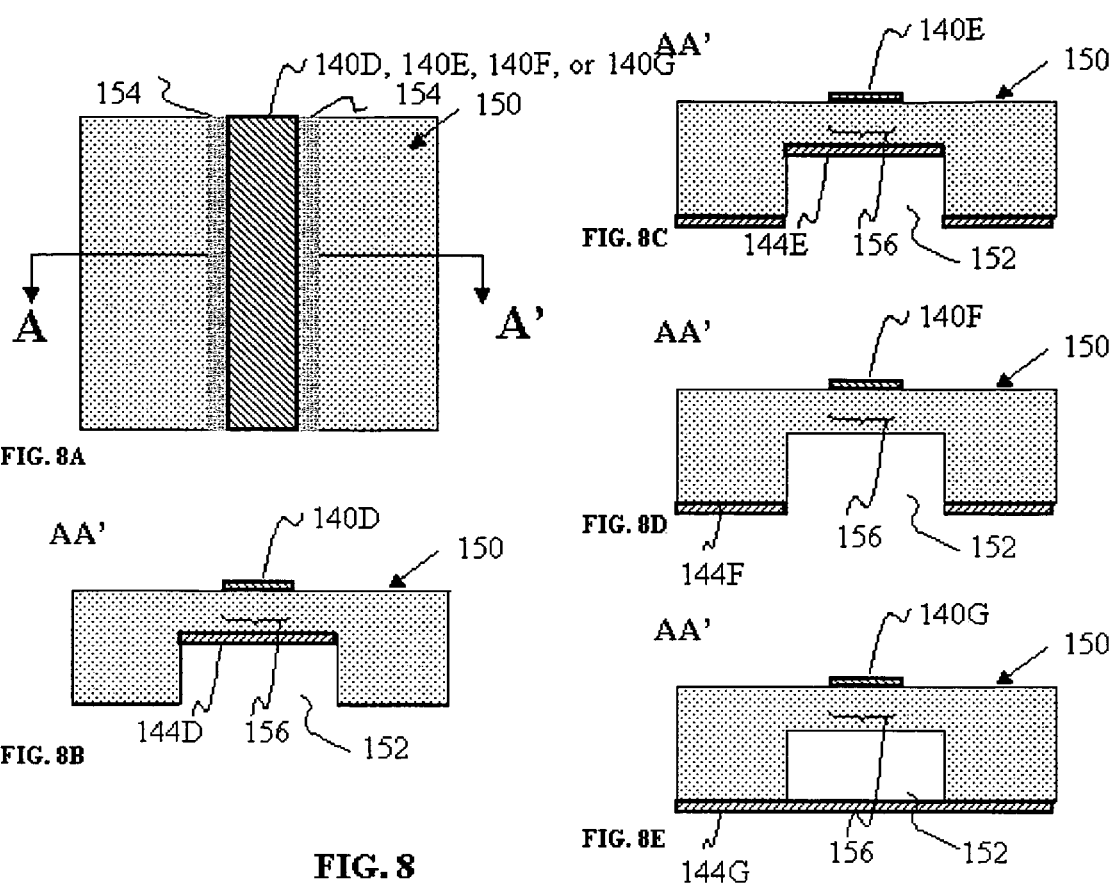

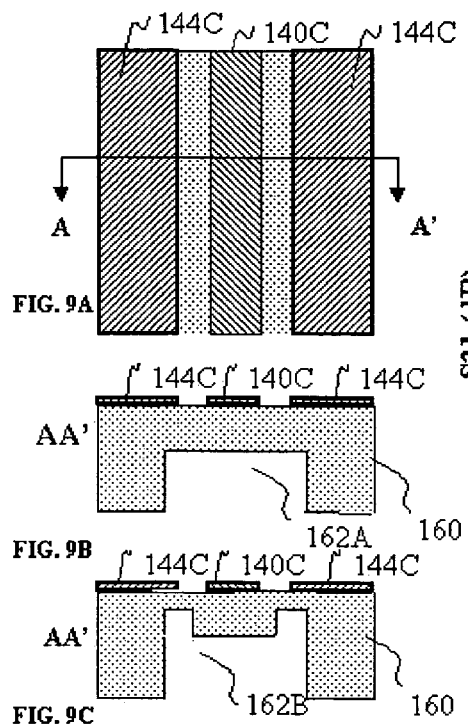
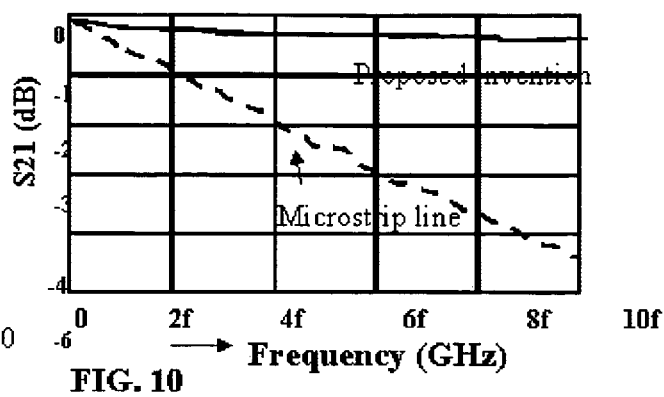
FIG. 9A
FIG. 9B
FIG. 9C
FIG. 9
FIG. 10

HIGH SPEED ELECTRONICS INTERCONNECT AND METHOD OF MANUFACTURE

CROSS REFERENCE TO RELATED APPLICATIONS

This application claims the benefit of U.S. Provisional Application No. 60/451,950 filed Mar. 5, 2003.

FIELD OF THE INVENTION

This invention relates to interconnection of electronics elements in on-chip (intra-chip) and off-chip (inter chip) level interconnection, high-speed connector, cable fabrication, and also high speed packaging. More particularly, this invention is related to, (a) connecting two or more electronic devices inside the chip (for intrachip connection), (b) connecting the high speed signal line of single or multi processor chips to signal line of single or multi memory chips, which are used in all kinds of computers covering from personnel computer to super-computer, server, storage system, and also in game system, (c) also interface means (as the connector or cable) to connect two or multiple high speed electronics elements, and (d) also high speed packaging to connect the chip to package. This invention is also related to the high-speed electrical interconnection, optical interconnection or both electrical and optical interconnection where two or more high-speed electronics and/or optical elements are required to be connected.

BACKGROUND OF THE INVENTION

The increasing of higher level of integration within electrical integrated circuit (IC) leads to both higher data rates and larger number of IC interconnections. Today, the inherent signal speed of IC is increased to 3 GHz, and shortly it will be reached to 10 GHz and beyond. The number of pin connection is also increased, with single IC requiring close to 2000 interconnection (i.e. single processor), and shortly it will be increased to over 5000. Simultaneously achieving higher data rates and higher interconnect densities for both on-chip and also off-chip, will be increasingly difficult as the IC technologies continue to evolve increasing signal speed of electronic devices and interconnection number. In on-chip cases (intra chip), as the number of the electronic devices such as transistor are increasing with development of the fabrication technology, the interconnecting the electronic devices without sacrificing the signal speed is getting challenging. In off-chip case, high density interconnects, covering from die-level packaging to chip-to-chip (hereafter chip indicates the die with package) interconnection on the printed circuit board (PCB), will also be getting increasingly difficult as the IC technologies continue to evolve increasing the signal speed and interconnection number.

With increasing of the signal speed and interconnection number within and outside of the IC, low-cost high-level interconnect technique compatible to today's manufacturing process are highly desirable to make available in consumer level.

Generally, it is known that if the electronic devices (for both on-chip and off-chip) are connected with the help of the metal conductor, electrical signal can be flown and the electronic device can be communicated with each other. This is true for the low-speed signal, below few MHz. In high-speed interconnection for both on-chip and off-chip interconnects, all connected signals should be considered to be propagated through well impedance matched transmission line. Any discontinuities in the electrical signal line due to impedance impedance mismatch, or the VIA etc. cause the reflection, which degrades the signal waveform reaching to the other side of the electronics devices. At multi GHz frequencies, interconnect lengths become a significant fraction of the wavelength of the high frequency harmonics, and therefore interconnects must be design with proper concern of impedance, cross talk, and attenuation. Impedance mismatch must be minimized to reduce the reflections and prevent ringing, which can cause false decision (switching) in the receiver signal. Significant attenuation and rise-time degradation can be caused by losses in the transmission line. The transmission line loss is the sum of the conductor loss and dielectric loss, both of which are dependent on the frequency.

Today technology development pushes to reduce the size of the electronic device, resulting in utilization of number of the devices inside single chip. As the level of integration targeting for future 'system-on-a-chip' design, is increasing, the chip area is also increasing. Novel interconnection technique compatible to standard IC fabrication technology is necessary; yet preserve the signal speed while assuring the adequate isolation for high-speed data communication. With increasing of intrachip signal speed, the interchip (off-chip) signal speed also increases, which require also novel technique, which could be also compatible to today's PCB technology.

FIG. 1 and FIG. 2 are the schematic showing part of conventional on-chip (intra) and off-chip (inter-chip) interconnections. In on-chip interconnection as shown in FIG. 1, single substrate 100 comprises with many electronics devices 102, and are connected by the metal conductor 104. Dielectric layer 106 such as silicon oxide for Si device isolates each device. Metal conductor such as Al, Cu, W, and WSi etc. is used for connecting on-chip devices.

In off-chip interconnection, as shown in FIG. 2, the chip 120 (for example processor) is connected with chip 130 (for example 3) by multilayered electrical signal lines 110 in the PCB 105. FIGS. 3 and 4 show the schematic representing the conventional BGA (ball grid array) and CSP (chip-scaled package) based packaging for high-speed single chip package (for example processor). In both type of packaging, die 122 and die 132 are attached with the ceramic or polymer substrate 124 and 134, respectively, containing the matrix of pins 126 and 136. Outside pins 128 and 138, located at the bottom-side of chip package (in both packaging cases) connect with the PCB, whereas topside of the package is connected with the heat sink to dissipate heat from the die. Both types of packages provide closer proximity of signal as on-chip. The fidelity of signal occurred due to the conventional interchip electrical signal connections 110 and ground/power 112 through multiplayer PCB 108. It is highly desirable having the board-level electrical interconnects for high-speed interchip connection, which could be compatible with existing IC package such as BGA, CSP etc., and also could be employed conventional PCB technologies.

Today's interconnection technology for both on-chip (intra-chip) and off-chip (inter-chip) are mainly based on the microstrip line or strip-line transmission layout on the dielectric material. FIG. 5A shows a cross-sectional of a microstrip layout, which refers to a trace routed as the top or bottom layer for example of a PCB for the case of off-chip interconnection. The electrical conductor 140A with width W and thickness T are laid on the dielectric material 142A having height H. The ground or power line 144A is located opposite of the signal conductor 140A. FIG. 5B is the cross-sectional view of strip line layout, which uses a trace 140B routed on the inside layer 142B for example of a PCB and has two voltage-reference planes (i.e. power and/or ground) 144B and 144B'. The impedances of microstrip line and strip line are expressed by:

$$Z_{microstrip}=[(87/\text{Sqrt.}(\in_r+1.41)]ln[(5.98\times H)/(0.8W+T)]\Omega \quad (1)$$

$$Z_{strip}=[(60/\text{Sqrt.}(\in_r))]]]ln[(4H)/(0.67\,\pi(0.8W+T))]]]\Omega \quad (2)$$

Equations (1) and (2) indicate that the impedance is directly proportional to the dielectric constant $\in_r$, trace height H, and the inversely proportional to the trace width W and trace thickness T. In stripline layout, the signal line is sandwiched by the dielectric layer, whereas a microstrip layout has one conductor open to air. In microstripline type traces, the field is in both dielectric layer and air whereas in strip line type traces, the filed is confined inside dielectric materials. This causes a higher, effective dielectric constant stripline layout compared to microstrip layouts. Besides, these also causes the less dielectric loss in microstripline as compared with stripline. Higher effective dielectric loss experiences much dispersion or signal loss as compared with that of the microstrip line layout. FIG. 6 shows the top view and cross-sectional view of the microstrip line transmission layout, showing the electrical field distribution. The electrical field 146A is spreading both side of the electrical signal line 140A. FIGS. 7A and 7B are the frequency response of the microstrip line and strip line layout. As the effective dielectric constant (using of the same material) of the strip line layout is higher than that of the microstrip line layout. The signal is attenuated more in strip line layout in compared with increasing of the frequency. This also suggests that effective dielectric loss should be kept low to increase the bandwidth of the interconnection.

High-speed signal while propagating through the transmission line experiences the signal propagation delay, and it is dependent on the dielectric constant of the material. The signal propagation delay for the strip line and microstrip lines are expressed by:

$$t_{PD\,microstrip}=85[\text{Sqrt.}(0.475\in_r+0.67)] \quad (3)$$

$$t_{PD\,strip}=85[\text{Sqrt.}(\in_r)] \quad (4)$$

Equations (3) and (4) indicate that as $\in_r$ increases, the propagation delay also increases. Microstrip line has comparatively lower propagation delay than the strip line layout for the fixed dielectric constant $\in_r$.

As mentioned earlier, electrical field inside dielectric material having higher dielectric constant experiences more signal delay as compared with that of transmission line comprising with lower dielectric constant material. These causes signal skews for the different length signal lines. In this case also, lower dielectric constant material is necessary in the interconnection for high-speed signal interconnection. This is true for both on-chip and off-chip interconnection. Lower dielectric constant material with low dielectric loss offers following functions;

(1) Higher density interconnection is possible due to reduction of the cross-talk;

(2) reducing the capacitance of the interconnection, helping to transfer the signal longer distance;

(3) lower propagation delay; and (4) reducing the microwave loss as the field is spread closer to the electrical conductor, and help to transmit the longer distance. In other words, help to transmit the higher speed signal as compared with the higher dielectric constant and with same loss tangent.

Besides the dielectric constant of the material or the type of the signal line, the microwave loss due to dielectric material and also the electrode structure also limits the bandwidth of the interconnection. Microwave-loss occurs due to the electrode structure mainly from skin-depth of the signal. As Cu's skin-depth at 100 GHz is 0.2 µm, the skin-depth due to the conductor structure is neglected. So, the bandwidth of the interconnection (for both on-chip and off-chip interconnection) is mainly dependent on the following factors:

(1) length of the interconnects; and (2) microwave-loss, mainly originated from the (a) dielectric constant, (b) dielectric loss tangent, and (c) electrode structure.

As the length of the interconnections in on-chip and off-chip varies from the few micrometers to 10 to 30 cm, the length dependency can be neglected. Mainly, the interconnection bandwidth is dependent on the dielectric constant and the material loss tangent.

It is very straight forward that increasing the bandwidth can be possible using of the material having the lower loss tangent (dielectric loss). However, in this case, for both on-chip and off-chip interconnection new material development is necessary. Additionally, manufacturing technology development is needed to implement product-level devices.

Much work can be found in both on-chip and off-chip interconnection technology focusing on the material development. As for example, in on-chip interconnection, low-K (dielectric constant) material is under development stage, to achieve lower dielectric constant than non-doped silicon oxide. Lowering the dielectric constant than silicon oxide is possible in some extend from material characteristic point view, which is not long-term technique, and beyond that different materials are necessary. Besides, implementing new material in chip fabrication process will cost tremendously to make it mature. Having low-K material for on-chip interconnection is not only time consuming development, but also the costly short-term solution. On the other hands, in off-chip interconnection, especially for the chip-to-chip interconnection, more focused are being paid on shortening the length or on the interconnection layout. In both cases, implementing technology would need to pay high cost.

As explained above, the conventional electronics interconnect technology being used in on-chip and off-chip interconnection cannot be used as the need of the signal speed is increasing. And also exiting conventional electrical interconnects have the limitation of achieving the bandwidth in certain level, beyond that complete manufacturing technology is needed to be changed which is costly for IC and PCB industries. It is highly desirable to have lower dielectric constant and lower dielectric loss (loss tangent) by adopt a technique or method which can be easily implemented, and which can use the standard dielectric material and IC and PCB technology.

SUMMARY OF THE INVENTION

Accordingly, it is an object of the invention to provide the technique to reduce the effective dielectric constant and effective dielectric loss of interconnection system material especially dielectric material, to increase the bandwidth of the interconnection.

According it is an object of this invention to use the inhomogeneous dielectric system to reduce the effective dielectric loss and dielectric constant of the dielectric material.

Alternatively, it is also an object to provide the technique to localize the electrical field (while transmitting), mostly outside the dielectric system where the dielectric loss is minimum and help to reduce the signal attenuation while transmitting through the signal line.

According to the invention it is an object to provide the interconnection structure where large portion of the signal (electromagnetic wave) is allowed to pass through the air or dielectric material having the dielectric loss les than the dielectric material on which the signal line is laid out.

Another object of the present invention is to provide the interconnection structure for intra-chip (on-chip) interconnection, which is compatible with available IC fabrication technology.

Another object of the present invention is to provide the interconnection structure for inter-chip (off-chip) interconnection on the board, which is compatible to available PCB technology.

Another object of this invention is to provide the structure for making the high bandwidth connector and cable. This helps to increase the bandwidth of the cable/connector tremendously using the existing material system.

Another object of this invention is to provide the fabrication technology of the technique implementable in on-chip interconnection using the standard fabrication process.

Another object of this invention is to provide the fabrication technology of the off-chip interconnection on the PCB board using the PCB technology.

According to the invention, the interconnect system comprises:
(i) single or multiple electrical conductors for carrying the electrical signal from one electronics elements to another and vice-versa for electrical communication;
(ii) a dielectric system comprising with the structure of back slot or trenches with deepness and width, and located under the signal line (conductor);
(iii) a ground or power line opposite side of the dielectric system;

wherein the shape of the back-slot or trench could be rectangular or square or circular or any shapes convenient for manufacturing, and covering the length same less or more than the metal conductor carrying the signal.

According to the invention, the interconnect system comprises:
(i) single or multiple electrical conductors for carrying the electrical signal from one electronics elements to another and vice-versa for electrical communication;
(ii) a dielectric system comprising with the structure of back slot or trench with deepness and width, and located under the signal line (conductor);
(iii) a ground or power line opposite side of the dielectric system, and;
(iv) a dielectric system coverage on the electrical signal line (conductor), wherein the shape of the back-slot or trench could be rectangular or square or circular, or any shapes convenient for manufacturing, and covering the length same less or more than the metal conductor carrying the signal.

According to this invention, the electrical signal line could be microstrip type or strip line type or coplanar type waveguide.

According to this invention, the electrical signal line could be microstrip type or strip line type or coplanar type waveguide.

According to the invention, the trench or back-slot of the dielectric system can be filled by the dielectric material having lower dielectric loss than the dielectric material on which the signal line is drawn.

According to the invention, the trench or back-slot of the dielectric system can be filled with air or kept in vacuum.

According to the invention, the trench or back-slot of the dielectric system can be filled by the liquid crystal material, which can tune the dielectric constant and loss.

According to this invention, the high speed communication can be possible between two or among more than two electrical (or optical) elements where electrical, optical or both electrical and optical signal are used for transmission through the interconnects According to this invention, the effective loss tangent and effective dielectric constant of the dielectric system is reduced, which reduce the microwave-loss and makes to increase the interconnects bandwidth for high speed electrical signal propagation, and also reduce the signal propagation delay. The lower the microwave loss, the closer to be the electromagnetic wave to the speed of the light.

The invention offers to connect the signal line of one electronics elements to other electronic elements to communicate without sacrificing each electronic element's signal speed. These inventions could be easily implementable as today's manufacturing technology can be used. The methods described in this disclosure enables to make the electronics interconnects for intra-chip, inter-chip connection in cost-effective manner and suitable for practical application. These inventions also used to high speed (bandwidth) electronic connector, and cable where two or more electronic elements are to be connected.

Another advantage of this invention is that conventional IC fabrication technology for on-chip interconnection, and conventional PCB technology for off-chip interconnection, and also conventional manufacturing technologies available for connector and cable manufacturing.

The other object of this invention is to minimize the skew in the signal interconnection, occurred due to the signal propagation delay, by reducing the microwave loss.

Other objects, features, and advantages of the present invention will be apparent from the accompanying drawings and from the detailed description that follows.

BRIEF DESCRIPTION OF THE DRAWING

The invention will be explained in more detail in conjunction with the appended drawings wherein.

FIGS. 2A, 2B, and 2C are the top, front and side cross-sectional views' showing prior art of electrical interconnects for inter-chip (off-chip) connection;

FIGS. 3A and 3B are top and cross-sectional views showings BGA based chip package for high-speed die package. This is an explanatory diagram showing chip package as mentioned in FIGS. 2A, 2B, and 2C;

FIGS. 4A and 4B are top and cross-sectional views showings CSP based chip package for high-speed die package. This is an explanatory diagram showing chip package as mentioned in FIGS. 2A, 2B and 2C;

FIGS. 5A and 5B are the simplified cross-sectional views of the microstrip and stripline transmission line. This is an explanatory diagram showing the prior-art based on which today's electronic interconnection is made;

FIGS. 6A and 6B are the top and cross-sectional views, showing the electrical field distribution for the microstrip line transmission line. This is an explanatory diagram showing the prior-art based on which today's electronic interconnection;

FIG. 8A is the top view, and FIGS. 8B 8C, 8D, and 8E are the cross-sectional views taken along AA' section, illustrating the signal line configuration on the dielectric system having backside slot or trench under the signal line, in a first preferred embodiment according to the inventions;

FIG. 9A is the top view, and FIGS. 9B, and 9C are the cross-sectional views taken along AA' section, illustrating the signal line configuration on the dielectric system having backside slot or trench under the signal line in a second preferred embodiment according to the invention;

FIG. 10 is the frequency responses (S21) comparing the conventional microstrip transmission line on the uniform dielectric, and microstrip transmission line on the proposed dielectric system third preferred embodiment according to the invention;

FIG. 11B is taken along AA' direction of FIG. 11A;

DETAILED DESCRIPTION

Figure 1:
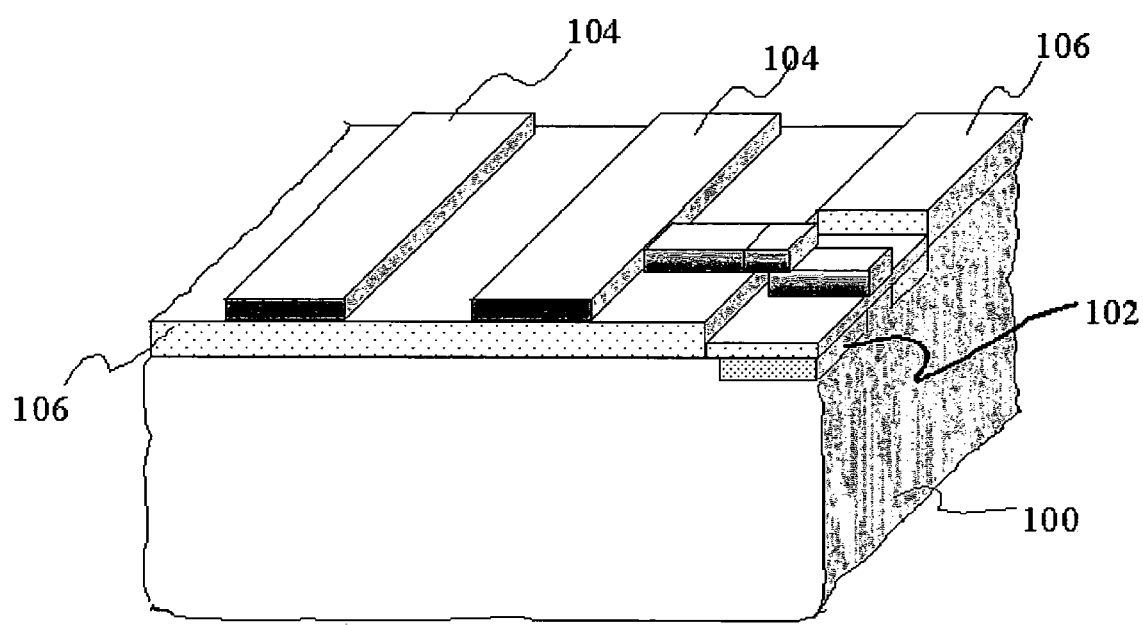
FIG. 1 is the cross-sectional view showing the prior art intra-chip (on-chip) electrical interconnection. For simplicity, MOS-transistors and their electrical interconnections is shown.
Figures 7, 7A, 7B:
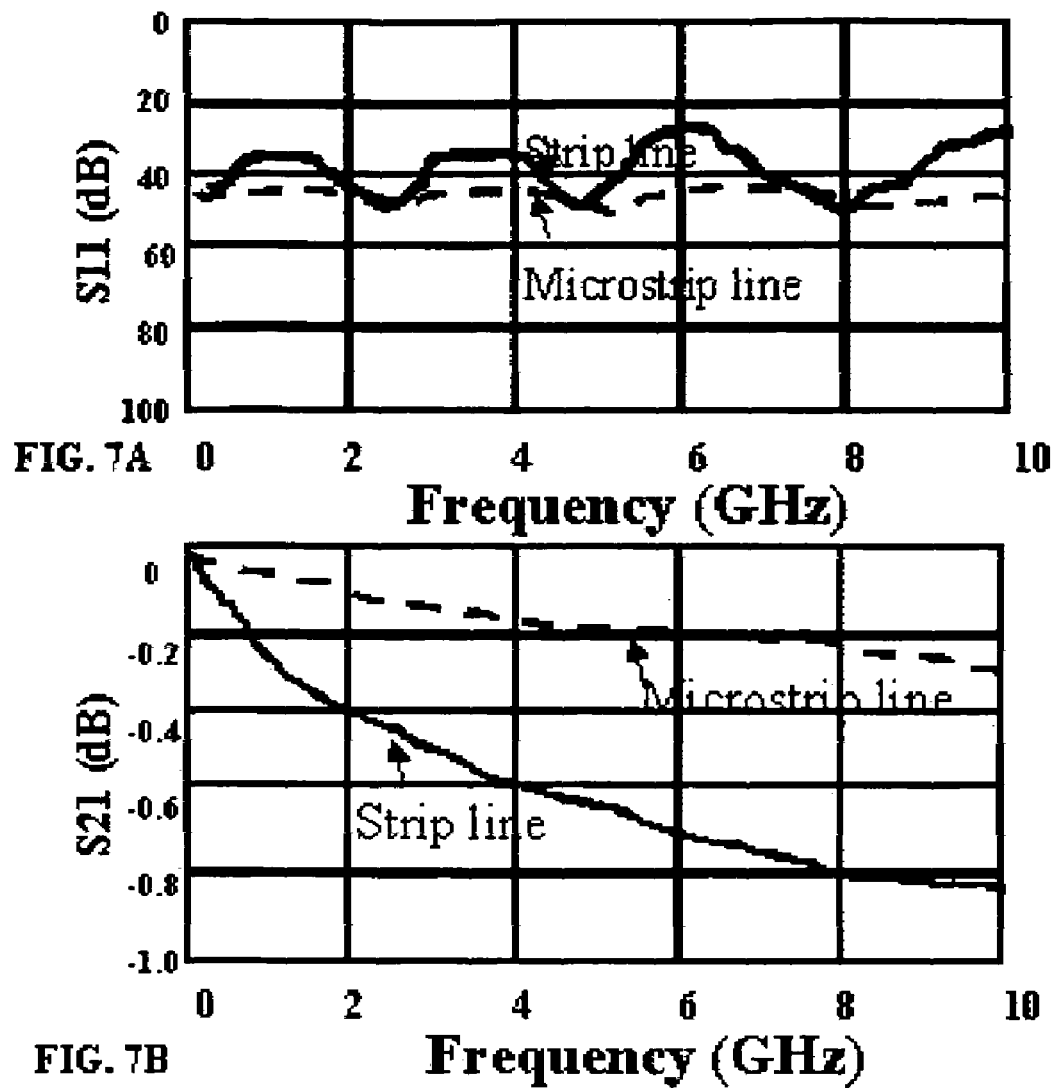
FIGS. 7A and 7B are the frequency responses (S11 and S21) of the microstrip and strip transmission lines. This is an explanatory diagram showing the prior-art of today's interconnection.

The best modes for carrying out the present invention will be described in turn with reference to the accompanying drawings. In the following description, the same reference numerals denote components having substantially the same functions and arrangements, and duplicate explanation will be made only where necessary.

An important point of high speed electronic interconnects system according to the first embodiment is that the microwave loss is to be reduced by reducing the effective dielectric constant, resulting in increasing the bandwidth of the interconnects and keeping the signal-speed of the interconnection system closer to the source speed. Other point is also kept into mind that the technique is to be cost effective, and compatible to standard manufacturing technology can be used.

In interconnects system for two or more electronics elements (on-chip electronic devices such as transistors, or two or more ICs etc.) connections, the signal can be conveyed electrically through the wire (electrical conductor) laid on the dielectric medium. For high speed signal transmission electrical conductor is to be transmission line of type microstrip or strip line. The signal speed in the interconnects (i.e. bandwidth of the interconnects system) is mainly dominated by; (a) signal conductor parameters (i) length and (ii) thickness, and (b) dielectric material properties (i) dielectric constant, and (ii) loss tangent. Longer interconnect length will increase the capacitance by $A \in L/d$, where A is the area of the signal conductor, $\in$ the dielectric constant of the material, and d the thickness of dielectric material. With optimized design, capacitance is mostly limited by the dielectric constant. As frequency increases the signal is started to attenuate due to the skin effect. For example Cu at 100 GHz, the skin-depth ($\delta$)=0.2 µm. For comparatively lower frequency, this skin-depth can be neglected. Therefore, bandwidth of the interconnect system is mainly dominated by the dielectric material properties such as dielectric constant and loss tangent. For increasing the bandwidth of the interconnects, their values should be low.

It is very straight forward that increasing interconnects bandwidth can be possible by using of the low dielectric constant material in both on-chip and off-chip interconnects. However, in both applications, new materials are needed to be developed and manufacturing technologies are to be developed to implement new material into practical interconnects.

It is highly desirable to invent the interconnect structure which have low effective dielectric constant, and which could use conventional manufacturing technology.

In the preferred embodiments explanation, first the techniques to reduce the effective dielectric constant will be explained considering the single signal, and later part of this section cover the applications of the preferred embodiments.

FIG. 8A is the top view and the FIGS. 8B, 8C, 8D, and 8E are the cross-sectional views of the portion of the interconnects system, taken along AA' direction of FIG. 8A, in the first preferred embodiment in accordance to the present invention, wherein like parts are indicated by like reference numerals as used previously, so that repeated explanation is omitted here. In FIG. 8A, the microstrip line configuration consisting of signal line 140D (140E, 140F, and 140G) and backside ground 144D (144E, 144F, and 144G), is used on dielectric system 150 with backside slot 152. The backside slot 152 is filled with the air or dielectric material (not shown) having lower dielectric loss than the dielectric material 168. According to this invention, the effective dielectric loss (loss tangent of dielectric system) can be reduced and the signal attenuation while attenuating through the signal line can be reduced. In other words, signal transmission is less dispersive, and higher bandwidth of the interconnects system is ascertained, as compared with the conventional interconnects where signal conductor is laid onto the uniform dielectric medium, as shown in FIG. 6 as prior art example. Less cross talk is also expected as the filed is more localized. Based on the design, the significant of the electromagnetic wave can be made to pass through the backside slot 152. The effective dielectric constant (i.e. microwave index) is also considerably decreased, and the signal propagation time (delay) can be tremendously reduced. The electrical field intensity 154 inside the slot increased, which is due to the electric field, leaks out effectively into the backside (air or lower dielectric loss material). This helps to reduce the effective dielectric loss and the effective dielectric constant (microwave index). The width of the trench or backside slot 152 can be adjusted based on the signal line width 156. The signal line impedance can be designed by designing the trench and the signal line.

FIG. 9A is the top view and the FIGS. 9B and 9C are the cross-sectional views of the portion of the interconnects system, taken along AA' direction of FIG. 9A, in the second preferred embodiment in accordance to the present invention, wherein like parts are indicated by like reference numerals as used in FIGS. 6 and 8, so that repeated explanation is omitted here. In FIG. 9A, the coplanar line configuration consisting of signal line 140C and both sides ground 144C, is used on dielectric system 160 with backside slotted (162A or 162B). According to this invention the effective dielectric loss and dielectric constant (i.e. microwave index) are considerably decreased as mentioned in earlier. The explanation on for getting the high bandwidth is already explained in FIG. 8, so that related explanation is omitted here.

FIG. 10 comparing the frequency responses of microstrip configurations shown in FIG. 6 and FIG. 8, as the prior art and the preferred embodiment in the third embodiment according to the invention. Due to reduction of the microwave-loss, the frequency response can be improved tremendously as compared with the conventional mircrostrip line where the electrical field is uniformly distributed away from the signal line.

According to the invention, based on the interconnect structure design, the effective dielectric loss and effective dielectric constant of the interconnect system can be controlled. This helps to add many features in the interconnection such as varying the phase velocity (which is function of the dielectric constant), varying the bandwidth of the interconnect; help to adjust the skews of the signal etc. in the single interconnect system. According to the preferred embodiment, ideally, the speed of the signal in the signal line can be made to speed of the light in the air, if other loss due to the signal line structure such as the electrode parameter (resistance, capacitance) are neglected. The bandwidth of the electronic interconnect system can be possible to make the closer or greater than optical fiber (closer to the light). In the example, the dielectric system consisting of the backside-trench or backside slot is considered. This invention covers all high-speed interconnect systems applying in the on-chip and off-chip application. This also includes the means such as the connector and cable used to high-speed connection of electronic elements covering transistor to instruments.

Using single or plural of dielectric layer with trench or slot under the high-speed signal line, broadband interconnects can be designed. For simplicity, we have shown single layer transmission line, however this present invention also includes the system with more than single layer having the trench or slot under the signal line to increase the bandwidth of the interconnection system. According to the present invention, it is our object to control the propagation of the significant electrical field inside the trench or slot (filling with the air or low loss (and/or dielectric constant) material which thereby increasing the bandwidth of the interconnection system and reduce the signal propagation delay. In the preferred embodiments, as explained above from FIG. 8, the microstrip line configuration with single electrode is shown for signal line in the object of explaining the inventions. These inventions also cover single or multiple signal lines in other configuration such as strip line or coplanar-line configurations. Signal lines in these cases could be single or differential line. In the preferred embodiment, the single layer configuration with single electrode is shown for signal line, the present invention also cover other multi-layer configurations with single and multi electrodes and also any configuration such as stripline, microstripline or coplanar or combination of their configuration in each layer.

In the preferred embodiments, the dielectric substrate is mentioned in an object to cover all dielectric materials, which show the dielectric properties. The dielectric materials include all kinds of ceramic materials such as Duroid, FR4, AlN, $Al_2O_3$, Mullite ($3Al_2O_3$: $2SiO_2$), SiC, $SiO_2$, Silcion nitride, silicon carbide, Silicon-Oxy-Nitride, BeO, Cordie-rite(magnesium alumina silicate), BN, Glass (with different compositions), epoxy glass, CaO, MnO, ZrO2, PbO, alkali-halide (e.g. NaBr, NaCl) etc.) BN, BeO, and all kinds of low temperature cofired ceramics etc., and all kinds of the polyimides and benzocyclobutenes (BCBs) having dielectric properties. All kinds of polymer materials having dielectric properties falls also under this dielectric material. These dielectric materials can be made using high temperature ceramics processing or using the IC fabrication process. Polymer dielectric material also includes, but not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. Dielectric materials, which can be made using high temperature ceramics processing or using the IC fabrication process, also include this category. All standard polymers can be available from the standard manufacturer for example, Du-pont, Hitachi-Chemical, Mitsui, and Mitsubishi-Chemical Industries. Gore-Tex, Japan markets liquid crystal polymer.

In the preferred embodiments as explained FIGS. 8, and 9, dielectric systems having back-trench or back slot into the dielectric substrate are considered. The trench or slot could be the any dielectric material having lower dielectric constant than the dielectric substrate. Alternatively, the lower dielectric constant material can be air or vacuum. Alternatively, in the preferred embodiment, trench or slot can be filled up fully by the liquid crystal material or coated by liquid crystal. The electrical field can change the orientation of the liquid crystal and can have the control of the effective dielectric constant and dielectric loss of the dielectric system. This could also provide the tunability of the effective dielectric constant of the dielectric system.

According to the present invention, the technique of reducing the micro-loss by reducing the effective dielectric constant are explained in the preferred embodiments as shown in FIGS. 8 to 9. The preferred embodiments can be applied in much application in different ways and forms. For examples, preferred embodiments mainly can be used for high speed interconnects for connecting high-speed multiple (two or more) electronics elements. The application includes, but not limited to, (a) on-chip interconnects for example, for connecting the electronics devices and/or connection electrical and optical devices, (b) off-chip interconnects for example, connecting two or more electronics chips on the board, (c) high speed chip (die) packaging, (d) high speed electrical cable for connecting multiple electrical modules for example board-to-board interconnection, rack-to-rack interconnection, etc. and (e) high speed connector, used as interface means to connect high speed electronics elements.

In the preferred embodiments as explained below, different applications are explained in an object of showing the application (of the techniques to reduce the microwave loss and dielectric constant to increase the bandwidth and to reduce the signal propagation delay), but not limited to, the specific description provided.

Figure 11A:
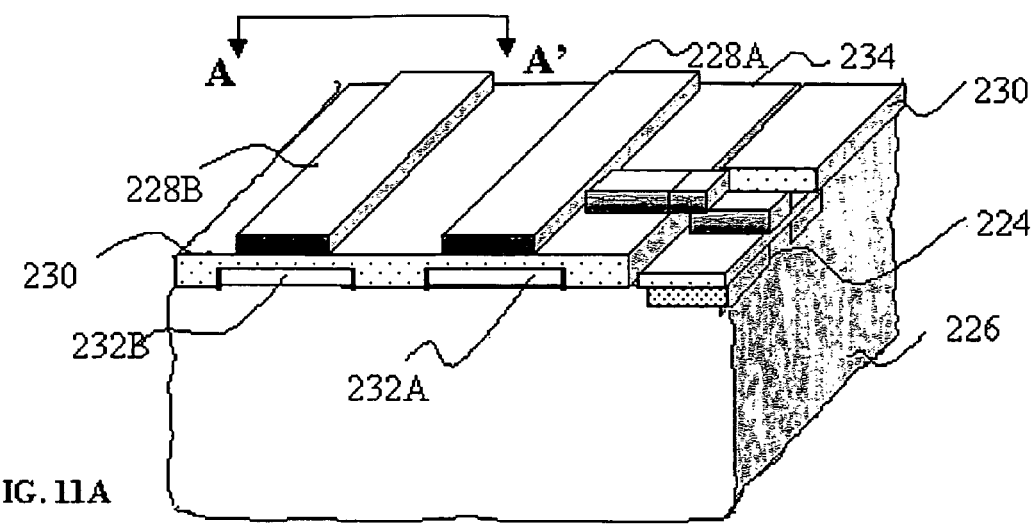
FIGS. 11A and 11B are the cross-sectional views, illustrating the on-chip (intra-chip) interconnections where signal lines are laid on dielectric system having backside slots or trenches, in the fourth preferred embodiment according to the invention.
Figures 11, 11B:
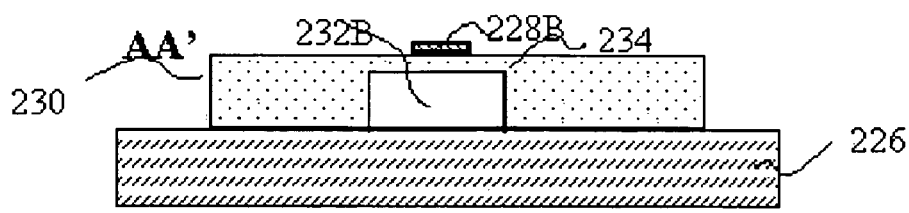

On-Chip Interconnection:

FIG. 11A is the cross-sectional view of a portion of on-chip interconnects system in the fourth preferred embodiment in accordance to the present invention, wherein like parts are indicated by like reference numerals, so that repeated explanation is omitted here. FIG. 11B is the cross-section view along AA' direction of FIG. 11A. In the preferred embodiment, electronic MOS (metal-oxide semiconductor)-device 224 on semiconductor substrate 226 (e.g. silicon) is connecting with other electronic device (not shown) by signal line 228A. Plurality of electronics devices on semiconductor substrate (for example Si (226)) can be interconnected by signal lines like 228A and 228B. The signal line 228A (and also 228B) is made on the dielectric system 230 having the trench or slot 232A and 232B, into the dielectric layer 230. The portion of the dielectric 234A (and 234B) over which the signal line is to be laid, are kept uniform. Coverage (not shown) can be used on top of the interconnects using the same dielectric material used in the dielectric system 230.

The dielectric layer 230 is deposited using standard IC fabrication technology such as chemical vapor deposition (CVD), or sputtering, or evaporation technique. The single or plural of the steps of deposition and dry-etching are required to make the trench. For dry-etching conventional etching such as reactive ion beam etching (RIBE), reactive ion etching (RIE), or milling etc. can be used.

According to preferred embodiment, on-chip interconnects using the dielectric system can have single or multiple techniques (for reducing the microwave loss), as explained in FIGS. 8 thru 9. Air hole arrays can be used in the dielectric system. Alternatively the low dielectric constant material or the liquid crystal polymer fills up the hole. Dielectric materials include all kinds vapor deposited dielectric material such as silicon oxide, silicon nitride, silicon oxynitride, silicon carbide etc. Microporous silicon can also be used as dielectric layer 230. Dielectric materials also include all kinds of the vapor deposited films such as silicon oxide, silicon nitride, silicon carbide, or polymer or spin-coated polymers such as benzocyclobutene, acrylate based polymer, elastomer or monomer etc. In the preferred embodiments as explained in FIG. 11 signal line configuration is considered. Other signal line configurations also includes, which are strip line, microstrip line or coplanar line configuration with single or multiple signal lines (as single or differential). Dielectric coverage (not shown) using of the same or different dielectric material can be used.

Off-Chip Interconnections:

In the preferred embodiment as explained below, it is an object to use the techniques as explained in FIGS. 8 to 9, in the off-chip interconnects for multiple chip interconnection on the board. The board here considered is the board made from FR4 material or any other kind of dielectric material as mentioned previously. Similar technique can be applicable for other dielectric material board as explained earlier.

Figure 12:
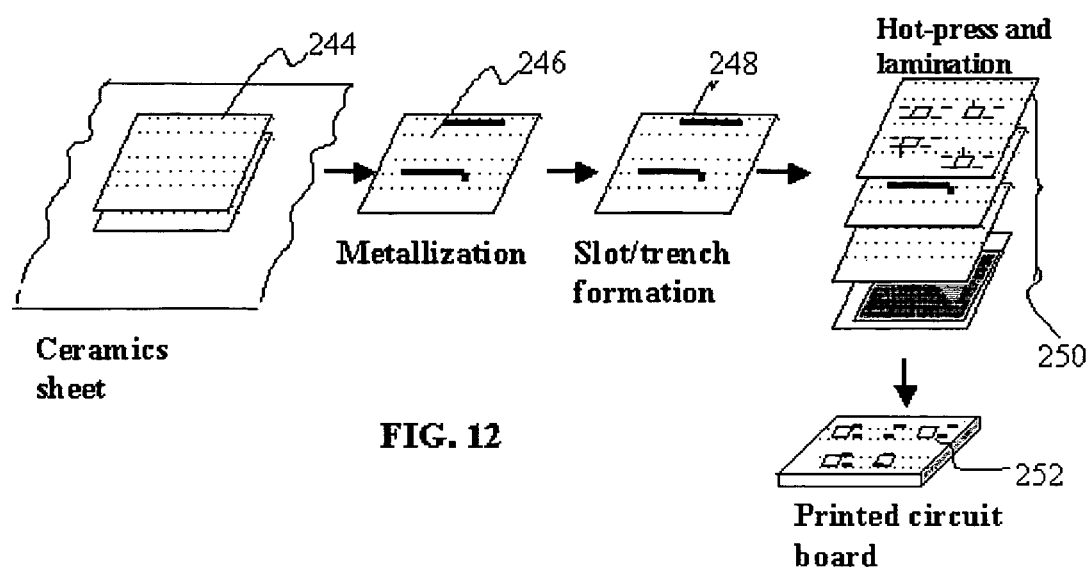
FIG. 12 is the schematics illustrating the fabrication process of the PCB based having the dielectric system with backside slot or trench in the fifth preferred embodiment in accordance to the present invention.

FIG. 12 shows the flow-chart of the printed circuit board fabrication process for the off-chip interconnects in the fifth embodiment in accordance to the invention, where in the like parts are indicated by the like numerals, so that repeated explanation is omitted here. The dielectric sheet (not shown) is made using the standard PCB technology for example using the slurry casting process. The slurry is cast into about 200 μm to 500 μm thick ceramic sheets by slip cast process. The PCB core layer 244 is the conventional PCB layer.

Metallization sheet 246 is made using the conventional PCB technology. After the metallization, the trench or slot is opened in sheet 248 by using the processes such as laser drilling, or dry-etching or wet-etching (following patterning for etching) or mechanical drilling. Via holes are formed through the dielectric sheet with air holes 244 by a punching machine with punches and dies. A ceramic sheet 244 may have more than 10,000 via holes in a 250 mm square area. Low resistivity conductor paste onto the punch sheet. In this process, via holes are filled with the paste to form the contacts between the signal lines. As the dielectric system have air holes. Additional process may necessary to fill the trench by air and filling the via holes which followed by wet etching of the to take filler out. Low electrical resistivity material such as silver-palladium, and gold instead of molybdenum or tungsten refractory material can be used. The sheets are sintered at high temperature, which makes lower electrical resistivity. Metallization sheet 246 is made using the conventional PCB technology. The trenched sheets 248 are precisely stacked in a pressing die in sequence by the stacking machine. These sheets 250 are laminated together by hot press. Density heterogeneities in the laminated samples influence any shrinkage in the sintered substrate. Therefore, this lamination process is homogenously carried out by means of the correct dimensional die and punch with flat surfaces. Burn out and sintering process for the multi-layered PCB board 252, may necessary after lamination at the temperature suitable to ceramic material used as the sheet.

Figure 13:
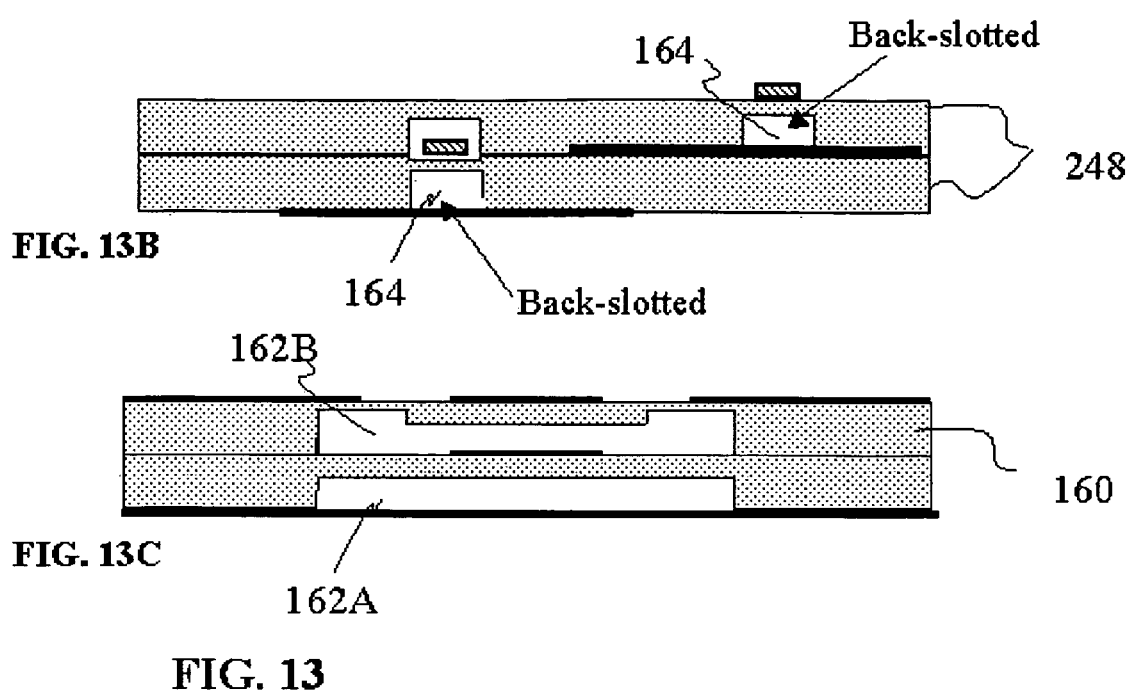
FIGS. 13A and 13B, are the enlarged cross-sectional views of 2-layer stacked PCB, illustrating the interchip interconnects on the in homogeneous dielectric system in the sixth preferred embodiment according to the present invention.

FIGS. 13A and 13B are the cross-sectional views of two layers of ceramic sheets having the dielectric structure as explained in FIGS. 8 to 9, in the sixth embodiment, wherein the like parts are indicated by the like numerals so that repeated explanations are omitted here. The metallization, stacking, and lamination can be carried out as explained in FIG. 12. The dielectric systems as shown in FIGS. 13A and 13B are already explained previously so that repeated explanation is omitted here.

Figures 14, 14A, 14B, 14C:
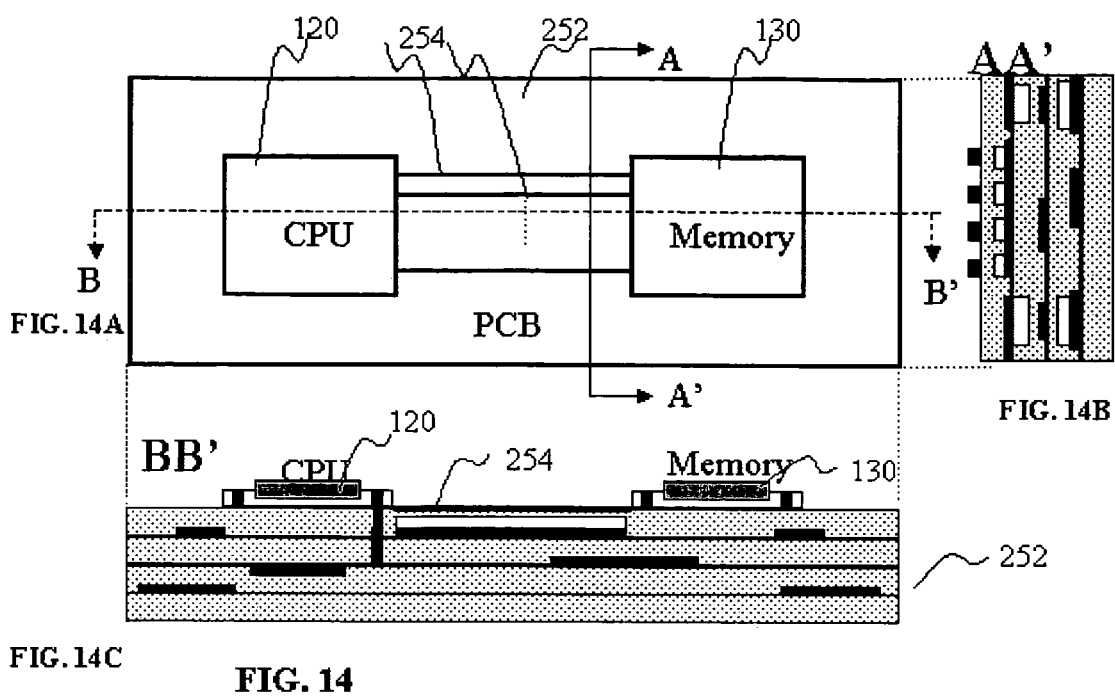
FIG. 14A is the top view and 14B and 14C are the side and front cross-sectional views along AA' and BB' direction of FIG. 14A, illustrating the interchip (off-chip) interconnections consisting of the multilayered PCB in the seventh preferred embodiment according to the present invention.

FIG. 14A is the top view and FIGS. 14B and 14C are cross-sectional views along AA' and BB' directions of FIG. 14A in the seventh preferred embodiment wherein the like parts are indicated by the like numerals, so that similar explanations are omitted here. In the preferred embodiment, two chips interconnection are shown. As an example, processor 120 and memory 130 interconnection are shown using the techniques explained earlier. The high speed signal line 254 can be taken from the top of the PCB layer and lower speed signal line can be take brought to the lower layer. This would reduce the possibility any discontinuities, which may arise due to the vias. Bandwidth of the interconnects using of the technique as mentioned previously, can be attained and thereby on-chip's signal speed can be preserved. According to the preferred embodiment as shown in FIG. 14, either whole portion of the PCB comprise with the periodic dielectric structure or the portion where the high speed chips needed to be connected, can have the back-trench or slot and the rest where low speed chips are needed to be connected, are having the uniform dielectric structure in the PCB. For simplicity in drawing, enlarge portion of cross-sectional views for high speed (e.g. processor and memory) chips portion interconnects are only shown. Complete PCB portion with considering lower speed chip interconnects are not shown.

Figure 15:
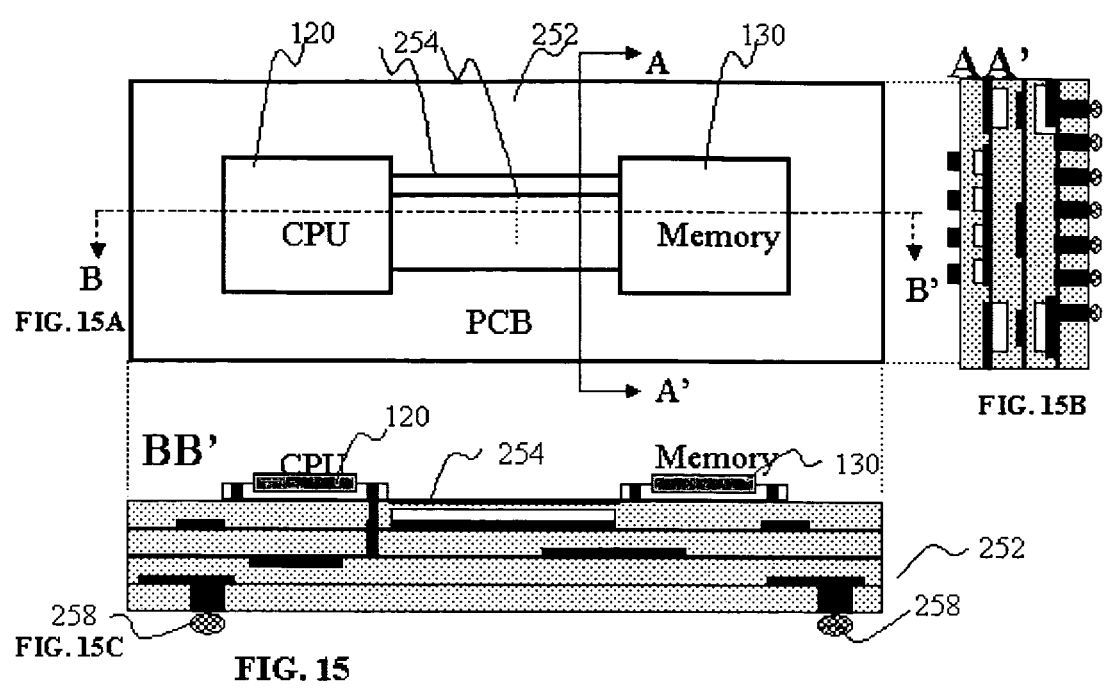
FIG. 15A is the top-view and 15B and 15C are the side and front cross-sectional views along AA' and BB' directions of FIG. 15A, illustrating mountable/stackable the interchip (off-chip) interconnections consisting of the multilayered PCB in the eighth preferred embodiment according to the present invention.

FIG. 15A is the top view and FIGS. 15B and 15C are enlarged cross-sectional views along AA' and BB' directions of FIG. 15A in the eighth preferred embodiment wherein the like parts are indicated by the like numerals as used in FIGS.

2 and 14, so that similar explanations are omitted here. In the preferred embodiment, two chips interconnection are shown. In the preferred embodiments, alternatively, the high-speed chips interconnect in the separate board 256 consisting of the periodic dielectric structure. For example for connecting the processor and memory, board with back-trench or slot can be used and they can be fabricated using the process as explained in FIG. 12. Each board has the pins 258 coming out from the outside of the PCB board 256 which can be mountable on to the conventional PCB board for ground/power and low speed connections.

The dielectric materials include all kinds of ceramic materials such as Duroid, FR4, AlN, $Al_2O_3$, Mullite ($3Al_2O_3$: $2SiO_2$), SiC, $SiO_2$, Silcion nitride, Silicon-Oxy-Nitride, BeO, Cordie-rite(magnesium alumina silicate), BN, Glass (with different compositions), epoxy glass, CaO, MnO, ZrO2, PbO, alkali-halide (e.g. NaBr, NaCl) etc.) etc., and all kinds of the polyimides and benzocyclobutenes (BCBs) having dielectric properties. Polymer dielectric material also includes, but not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. All standard polymers can be available from the standard manufacturer for example, Du-pont, Hitachi-Chemical, Mitsui, and Mitsubishi-Chemical Industries. Gore-Tex, Japan markets liquid crystal polymer.

In the preferred embodiments as explained in FIGS. 12 to 15, only microstrip line configurations are considered. However, in accordance with the present invention, other signal lines, not mentioned here, such as strip line, or coplanar line configuration with single or multiple signal lines (as single or differential) also include. Dielectric coverage (not shown) using of the same or different dielectric material can be used.

High Speed Connectors and Cables:

According to this invention, high speed connects and cable for multigigahertz signal interface/carry, can also be designed based on the techniques as explained in FIGS. 8 and 9. Reducing the microwave loss implementing the backside slots explained previously can able to increase the bandwidth of the connector and also cables. Single or differential connectors (and also cables) can be designed based on the techniques as explained previously, where the effective dielectric loss and effective dielectric constant are reduced.

High-Speed Chip Packaging:

According to this invention, high-speed chip packaging can also be designed based on the techniques as explained in FIGS. 8 and 9. Reducing the microwave loss implementing the backside slots explained previously can able to increase the bandwidth of the interconnects that connect the chip (die) and its package. Single or differential pairs lines can be designed using the inhomogeneous dielectric system comprising with two or more dielectrics wherein single or plurality of the dielectrics have the lower dielectric loss and dielectric constant as explained previously. High speed signal flowing through the interconnects are made to flow most portion of it into the lower dielectric loss material in dielectric system, resulting in the significant high bandwidth of the interconnects.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is the object to provide the interconnects technique by which the microwave loss can be reduce and increase the bandwidth of the interconnects. It is also the object to use any dielectric material (including conventional dielectric material and the manufacturing technology) in the technique and could increase the bandwidth tremendously. In simplicity of drawing, preferred embodiments are described mostly considering the microstrip line configuration. However, all line configurations such as strip line, coplanar line with single or multiple signal line (including differential line) also cover this invention.

According to the present invention, interconnect system uses inhomogeneous dielectric system to reduce the effective dielectric loss and dielectric constant, wherein the inhomogeneous dielectric system has two or more dielectrics, and one of them dielectrics has lower dielectric loss and dielectric constant. The interconnects using the dielectric system can have single or multiple techniques (for reducing the microwave loss), as explained in FIGS. 8 and 9. Trench or slot can be used in the dielectric system. Alternatively the low dielectric loss (and/or dielectric constant) material or the liquid crystal polymer fills up the hole.

The present invention is described here, considering only onto the high-speed electrical signal. However, the present invention can be also used in the interconnects system where both electrical and optical signal can be transmitted using the same signal line. For example, the trench portion is used to reduce the effective dielectric loss and effective dielectric constant. By using the opened backside slot or opened trench the signal is mostly flowing through the trench filled up with air or lower dielectric loss material. In the interconnects where both high speed electrical signal and high speed optical signal are considered, the trench or backside slot used can be used for flowing the optical and electrical signal, and significant bandwidth of the interconnects system with high integration capability can be realized.

Several preferred embodiments for high-speed on-chip and off-chips interconnects are described considering the microstrip line configuration and also the dielectric system with back-trench or slot. All signal line configurations as mentioned earlier covers under this invention. The shape of the trench could be could be any type such as square, rectangular, circular, trapezoidal or any polynomial shape, or any shape convenient for manufacturing. These can be filled up by dielectric material having the lower dielectric constant than the dielectric substrate.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

In particular, the present invention is expected to be found practically use in the high-speed on-chip, off-chip interconnects, where the signal speed 5 Gb/s and beyond are necessary using of the conventional material, and the bandwidth of the interconnects can be made to ideally to speed of the light for no-loss transmission line. The present invention can also be implemented in the high-speed single or multiple signal connectors, and high-speed cables (not shown). The applications include on-chip interconnects where high-speed electronics chips or electronics chips with optical chips are need to be connected. As ideally the bandwidth of the interconnect system can be made to close to fiber, future monolithic (and also hybrid near future) integration of electronics and optical chips can also interconnected without (much or none at all) sacrificing the chips speed. The application also includes the high speed multichip module interconnection, 3-D chip or memory interconnection, high speed parallel system for computer animation and graphics for high speed 2-D or 3-D video transmission, and high bandwidth image display, high speed router where high speed electronics switches (or IC) are needed to be interconnected. The application also include the high speed (5 Gb/s and beyond) connectors and cables for high speed board-to-board, rack-to-rack interconnection, and also single or multiple high-density signal connections and carrying from one side to other in longer path.

Of course, it will be understood by those skilled in the art that the foregoing is merely illustrative of the principles of this invention, and that various modifications can be made by those skilled in the art without departing from the scope and spirit of the invention.

What is claimed is:

1. A high speed electronics interconnection system for interconnecting two or more electronic elements on-chip, off-chip or board-board, said interconnection system comprising:
    at least one electrical signal plane;
    at least one ground or power plane;
    a dielectric system interposed between said ground or power plane and said electrical signal plane(s), such that one side of the at least one electrical signal plane is laid on the dielectric system and the second side of the at least one electrical signal plane is exposed to air or a dielectric material, the dielectric system comprising,
        at least one dielectric layer having at least one backside slot or trench formed under or over said electrical signal plane(s) within the at least one dielectric layer, wherein the backside slot or trench has a width less or more than the width of the electrical signal plane, and wherein the backside slot or trench is filled with a second dielectric material having a dielectric constant lower than the dielectric constant of the at least one dielectric layer;
    such that connecting two or more electronic elements on-chip, off-chip or board-board, via the at least one electrical signal plane reduces the microwave loss, thereby increasing the signal carrying capacity of said electrical signal plane(s).

2. The interconnection system according to claim 1 further comprising at least two ground planes or two power planes that are laid alongside the at least one electrical signal plane on said dielectric system in a coplanar configuration, wherein one each of said two ground planes or two power planes is located in close proximity of said electrical signal plane(s) on two opposite sides of the electrical signal plane, and wherein no said ground planes or power planes are located in a plane other than the electrical signal plane.

3. The interconnection system according to claim 1 wherein said backside slot or trench is located in close proximity with said ground or power plane and wherein said electrical signal plane(s) is located on the top or bottom side of said dielectric layer.

4. The interconnection system according to claim 1 wherein said backside slot(s) or trench(es) is located in close proximity to said signal plane(s), wherein said signal plane is facing toward said trench(es) or slot(s).

5. The interconnection system according to claim 1 wherein said backside-slot or trench is filled with a liquid coolant material.

6. The interconnection system according to claim 1 wherein said dielectric system further comprises:
    at least one uniform dielectric layer;
    a second dielectric system substantially similar to the dielectric system, comprising,
    a uniform dielectric layer having a backside slot or trench formed within the bulk of the dielectric material, wherein the backside slot or trench is filled with a second dielectric material having a dielectric constant lower than the dielectric constant of the at least one uniform dielectric layer, such that connecting two or more electronic elements on-chip, off-chip or board-board via the at least one electrical signal plane reduces the microwave loss.

7. The interconnection system according to claim 1 wherein said electrical signal plane and said ground or power plane comprises of an electrically conductive material.

8. A high speed electronics interconnection system comprising
    at least one electrical signal plane;
    at least one ground or power plane; and
    a dielectric system, between said ground or power plane(s) and said electrical signal line(s), comprising,
        at least one dielectric layer containing periodic dielectric structure forming 2-dimensional and 3-dimensional electronic crystal, created in the dielectric material by making cylindrical or spherical hole arrays having cell and lattice size and shape into the bulk of the said dielectric layer, resulting in a periodic variation of the permittivity, and;
        at least one backside slot(s) or trench(es) located under said signal plane(s) to reduce the microwave loss to increase the signal carrying capacity of said electrical signal plane(s),
    wherein said holes contain air or low loss dielectric material.

9. The interconnection system according to claim 1 wherein said interconnection system is stacked upon itself at least once.

10. The interconnection system according to claim 1, wherein said dielectric system, has another substantially similar dielectric system stacked on top of the dielectric system without any electrical signal plane interposed in between the two dielectric systems.

11. The interconnection system according to claim 1 wherein said slot(s) or trench(es) is filled or coated with a liquid crystal polymer, such that upon applying a variable voltage to the liquid crystal polymer, the dielectric constant (or dielectric loss) of the dielectric system exhibits tunability.

12. The interconnection system according to claim 1 in which the dielectric material and the second dielectric material in said dielectric system is selected from a group consisting of ceramic dielectric materials and polymeric dielectric materials.

13. The interconnection system according to claim 1, fabricated using IC fabrication technology or planar PCB fabrication technology for on-chip and off-chip interconnects, respectively.

14. An electronic chip-to-chip interconnection system for interconnecting packaged chips, said interconnection system comprising:

a first packaged chip and a second packaged chip located in close physical proximity of a multilayered printed circuit board (PCB), said PCB comprising:

at least one electrical signal plane;

at least one ground or power plane;

at least one dielectric system including;

at least one layer of a dielectric material having at least one backside slot or trench located under the electrical signal plane, wherein the backside slot or trench is formed within the at least one layer of the dielectric material, wherein the backside slot or trench is filled with a second dielectric material having a lower dielectric constant compared to the dielectric constant of the dielectric material and wherein the second packaged chip is connected to said first packaged chip through the at least one electrical signal plane of the PCB for lowering the microwave loss of the interconnection between the first and second packaged chips.

15. Interconnection system according to claim 8, wherein said backside slot(s) or trench(es) further comprises of said periodic structure.

16. The interconnection system according to claim 8 wherein said backside slot(s) or trench(es) is filled with the air or lower dielectric loss (and/or dielectric constant) material as compared with the said dielectric material.

17. The interconnection system according to claim 8 wherein said periodic structure can be fabricated using IC manufacturing process or it can be of porous material.

* * * * *